US008539417B2

(12) United States Patent
Huels et al.

(10) Patent No.: US 8,539,417 B2
(45) Date of Patent: Sep. 17, 2013

(54) GENERATING PHYSICAL DESIGNS FOR ELECTRONIC CIRCUIT BOARDS

(75) Inventors: Harald Huels, Boeblingen (DE); Dieter Staiger, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/457,551

(22) Filed: Apr. 27, 2012

(65) Prior Publication Data

US 2012/0284678 A1 Nov. 8, 2012

(30) Foreign Application Priority Data

May 2, 2011 (EP) .................................. 11164455

(51) Int. Cl.
*G06F 17/50* (2006.01)
(52) U.S. Cl.
USPC .............. 716/119; 716/55; 716/126; 716/139
(58) Field of Classification Search
USPC .................... 716/55, 119, 126, 139
See application file for complete search history.

(56) References Cited

U.S. PATENT DOCUMENTS

| 6,845,489 B1* | 1/2005 | Mizuno et al. ............... 716/106 |
| 7,216,324 B2 | 5/2007 | Chang |
| 2002/0198773 A1 | 12/2002 | Belluomini et al. |
| 2010/0219941 A1 | 9/2010 | Pagano et al. |

FOREIGN PATENT DOCUMENTS

WO WO2004110113 A2 12/2004

OTHER PUBLICATIONS

Mukkamala, P.S., et al., "Designing Reusable Simulation Modules for Electronics Manufacturing Systems," Proceedings of the 2003 Winter Simulation Conference, Dec. 2003.

* cited by examiner

*Primary Examiner* — Thuan Do
(74) *Attorney, Agent, or Firm* — Dennis Jung, Esq.; Blanche E. Schiller, Esq.; Heslin Rothenberg Farley & Mesiti P.C.

(57) ABSTRACT

Generating a physical circuit board design. The physical circuit board is designed based on a design data set containing multiple electronic components. In a first step, the electronic components are classified by assigning them either to a group of so-called Core Components or to a group of Application Specific Components. Subsequently, a circuit board layer structure is generated. The layer structure includes a Core Layer Structure located in the center of this layer structure. The components are placed onto the board's layer structure in such a way that the Core Components are placed onto the Core Layer Structure. Finally, a design macro of the resulting physical design is generated and the circuit board is assembled.

20 Claims, 10 Drawing Sheets

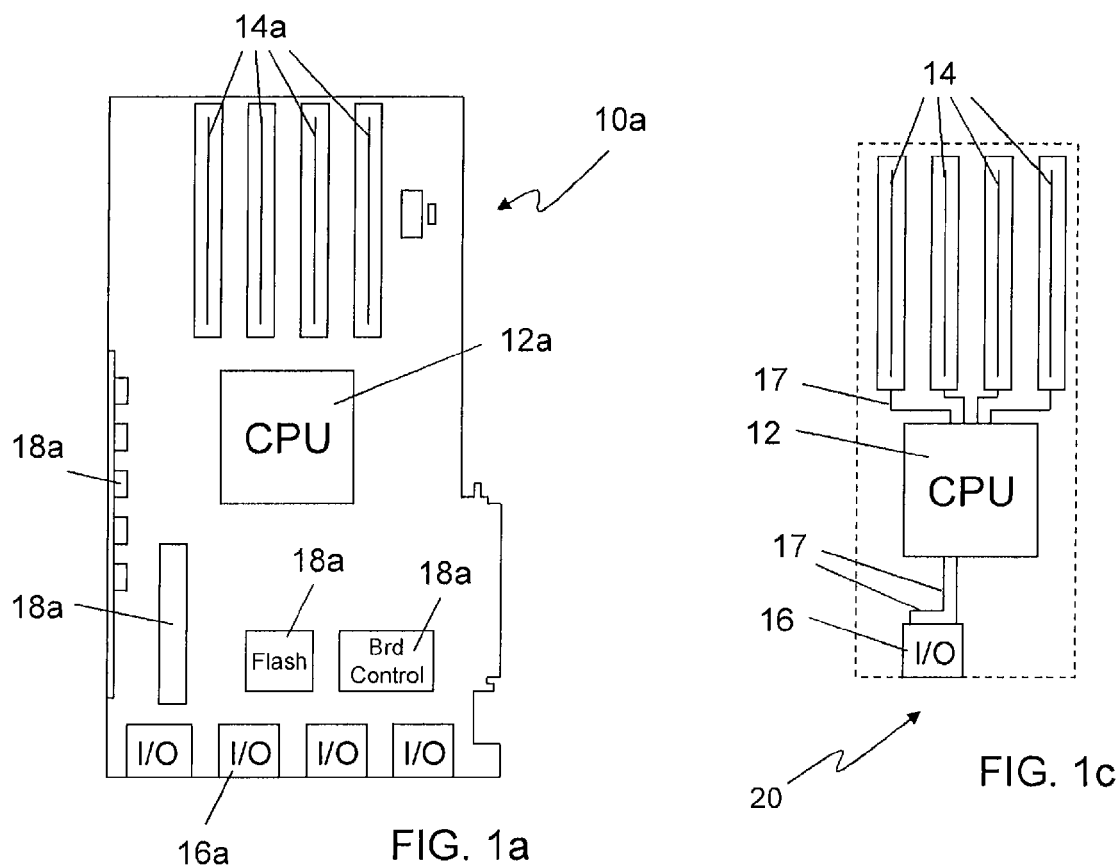
FIG. 1a
FIG. 1c
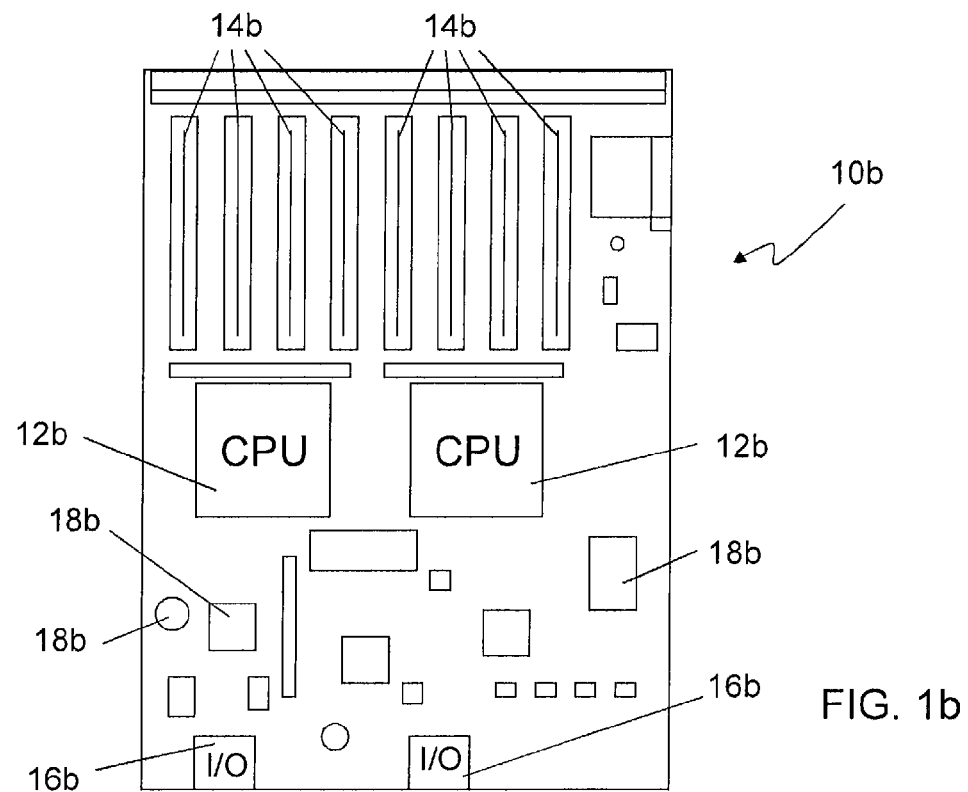
FIG. 1b

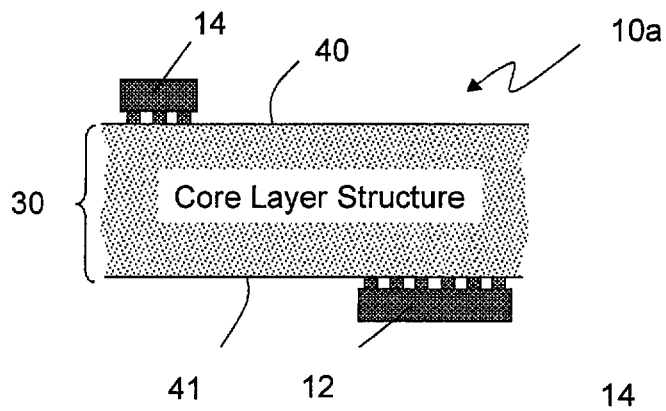
FIG. 4a
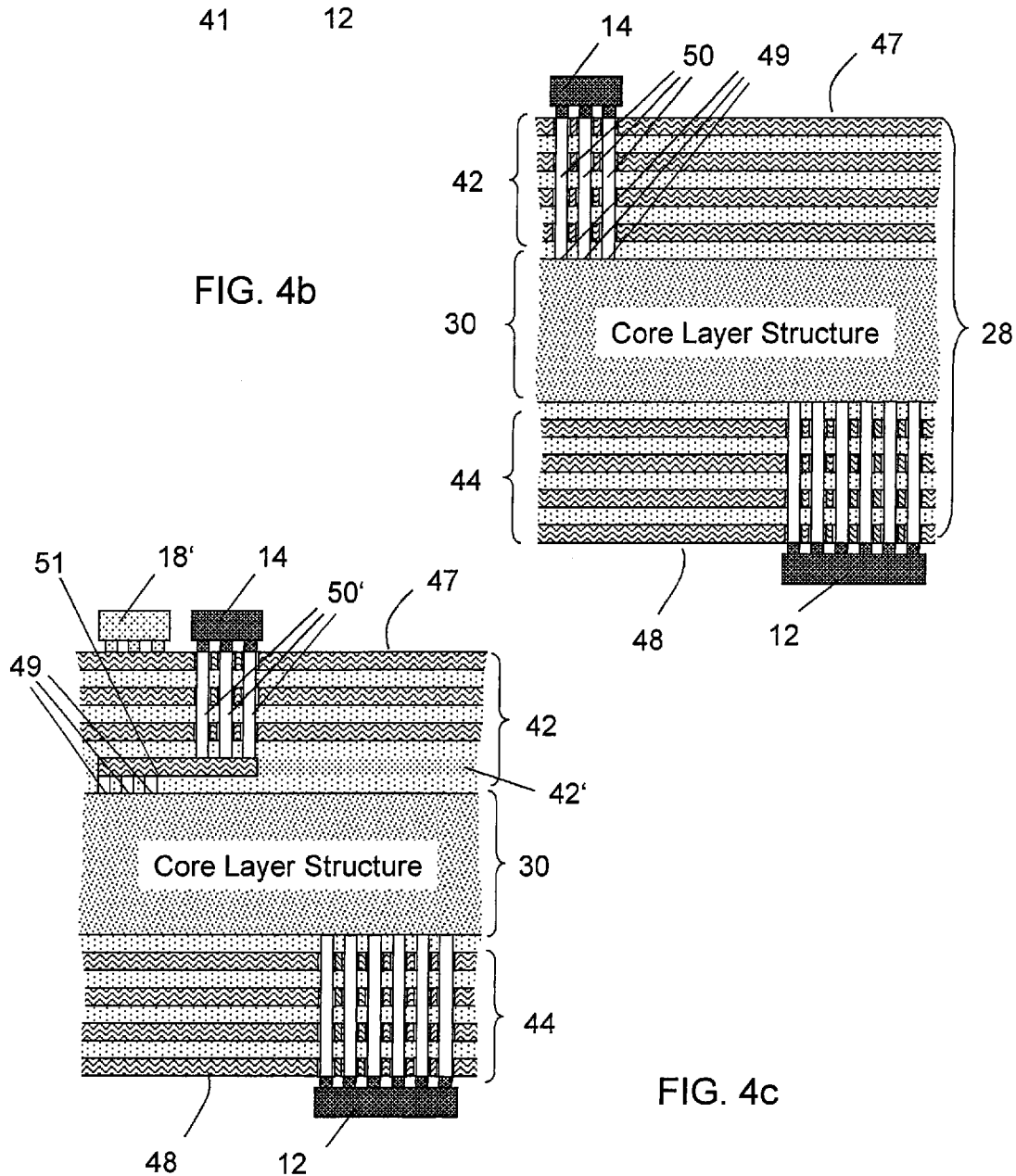
FIG. 4b
FIG. 4c

GENERATING PHYSICAL DESIGNS FOR ELECTRONIC CIRCUIT BOARDS

PRIOR FOREIGN APPLICATION

This application claims priority from European patent application number 11164455.5, filed May 2, 2011, which is hereby incorporated herein by reference in its entirety.

BACKGROUND

An aspect of the invention relates to the physical design of complex electronic circuit boards. Specifically, an aspect of the invention relates to designing planar circuit boards requiring multiple wiring planes.

The process of designing a new physical circuit board typically starts from scratch: The physical board layout, signal distribution and routing traces are specific to the design under construction and thus need to be individually developed for each new board design. If the new board design is known to comprise electronic functions and components which are identical to functions and components of a previous design, a system designer typically applies a "copy and paste" method on the abstract design level, thus reusing existing schematic design features including the associated wiring. Subsequently, new (product specific) electronic functions and components are added and connected by additional, newly designed schematics. This widely used approach speeds up the electronic circuit board design and reduces the risk of design errors. However, as this design is reduced into a physical design, this typically goes along with modifications and/or additions of wiring traces as well as new via definitions which, as a consequence, may lead to a new definition for the inner-plane assignment. This in turn may result in an altered design which requires additional timing and functional simulation as well as signal integrity simulation in order to ensure and verify the expected electrical and electronic behavior.

Prior art methodologies for generating physical designs of electronic circuit boards typically comprise the steps of
- estimating/calculating the required number of wiring planes,
- defining a "system wiring strategy",
- defining and calculating the system specific layer stacking,
- placing and wiring the components,
- carrying out simulations to verify timing and functional behavior as well as signal integrity (and, as a potential consequence, rewiring in order to meet timing and functional specifications),
- performing EMC/EMV measurements and tests which may lead to physical design corrections.

This step-by-step procedure is applied for each new or redesigned physical circuit board design—regardless of whether prior art circuit boards comprising identical or similar functionalities and identical or similar components are available.

BRIEF SUMMARY

According to one aspect of the invention, a method for generating a physical circuit board design based on design data comprising a set of electronic components is provided. The method comprises the steps of (1) classifying each of the electronic components of the design data as a Core Component or as an Application Specific Component, (2) generating a circuit board layer structure comprising a Core Layer, (3) placing the electronic components onto said board layer structure in such a way that the Core Components (12, 14, 16) are placed onto the Core Layer (30), (4) extracting a design macro of the physical design thus generated and (5) using the design macro for assembling the physical circuit board.

In one embodiment, a Core Module comprising multiple Core Components is defined. During the step of generating the design macro of the physical design, a design macro of the Core Module may be generated and stored in a data base for reuse in the physical design of other circuit boards comprising identical Core Components. By applying this modular approach to the design of physical circuit boards, development expenditures and redesign risks may be considerably reduced.

According to a further aspect of the invention, a method for generating a data base comprising so-called Core Modules to be used as modular building blocks in the design of physical circuit boards pertaining to a product family of these circuit boards is provided. The method comprises the steps of (1) receiving multiple design data sets of circuit boards pertaining to said product family, (2) identifying concurring functions/components of the design data sets (so-called Core Components) and defining at least one Core Module such that the Core Module comprises multiple Core Components, (3) generating a circuit board Core Layer Structure for accommodating the Core Components of said Core Module, (4) placing said Core Components onto said Core Layer Structure, (5) performing simulations of the physical design thus generated (6) extracting a design macro of the physical Core Module thus generated. The design macros of the Core Modules may be stored in a database for further use.

According to yet another aspect of the invention, a method for generating a second ("new") physical circuit board layout by reusing features of a first ("old") physical circuit board layout is provided. The method comprises the steps of (1) receiving a first ("old") physical circuit board layout and an associated first ("old") set of design data comprising a first ("old") set of electronic components, (2) receiving a second ("new") set of design data for the second ("new") physical circuit board which is to be generated, where said second ("new") set of design data comprises a second ("new") set of electronic components, (3) identifying Core Components as matching electronic components of the first ("old") and second set of design data, (4) extracting a Core Module from the first ("old") physical circuit board layout such that the Core Module corresponds to a wired layout of the Core Components, (5) adopting a circuit board layer structure of said Core Module as a Core Layer of a board layer structure for the second ("new") circuit board, (6) placing the second ("new") set of components onto the board layer structure, (7) extracting a design macro of the second ("new") circuit board design thus generated and (8) assembling said second ("new") circuit board.

BRIEF DESCRIPTION OF THE SEVERAL VIEWS OF THE DRAWINGS

Aspects of the present invention together with the objects and advantages may best be understood from the following detailed description of the embodiments, but not restricted to the embodiments, wherein is shown in:

FIG. 1a a schematic top view of a PCIe Card based on a given processor type;

FIG. 1b a schematic top view of an IBM Blade motherboard featuring two processors of the type shown in FIG. 1a;

FIG. 1c a schematic top view of a Core Module comprising a processor, DIMM memory slots and an I/O port;

FIG. 4a a sectional view of a Core Layer Structure pertaining to a first physical design for an electronic circuit board;

FIG. 4b a sectional view of a physical design reusing the Core Layer Structure of FIG. 4a, where transfer vias are provided for joining Core Components to the Core Layer Structure;

FIG. 4c a sectional view of a physical design reusing the Core Module of FIG. 4a, where an offset transfer layer has been introduced for accommodating a position sensitive application specific component;

FIG. 6b a schematic flow diagram detailing the placement step of the method of FIG. 6a;

Figure 2A:
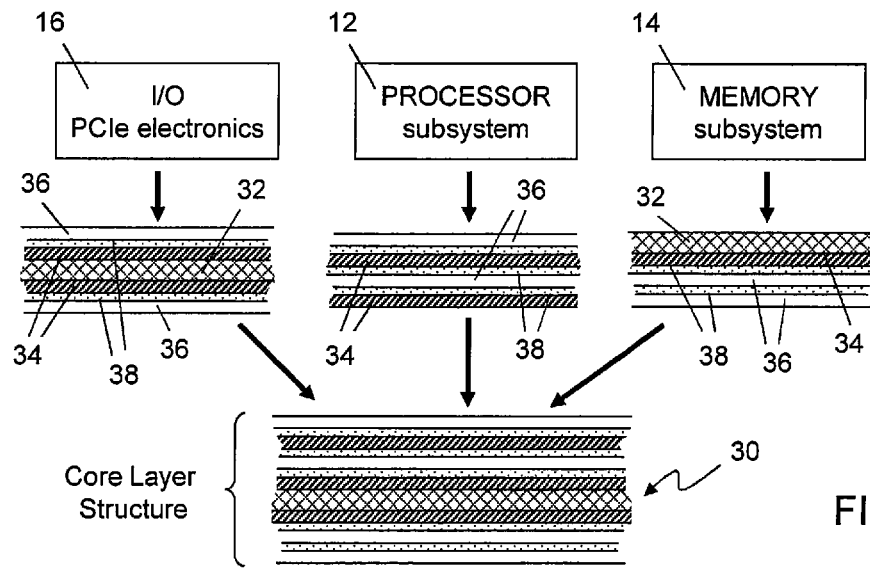
FIG. 2a a schematic representation illustrating the process of generating a Core Layer Structure of Core Module comprising three Core Components and their respective layer structures.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION

Prior art methods for physical board design are time consuming and costly: the physical board design process of any new system is not capable of effectively reusing features of other physical board designs employing identical or similar features. Rather, each new physical board design is a unique design with a specific layer stacking sequence and board layout, even though the board may have high functional synergy with preceding designs. In order to decrease time to market and to optimize development cost, it is desirable to apply a methodology which is capable of reusing features of preceding similar board designs or to take advantage of design communalities of product families to a larger extent.

Moreover, it is well known that complex high speed electronic designs are sensitive with respect to signal integrity and timing constraints as well as absolute timing accuracy. In addition, it is known that entirely new designs are subject to redesign risk, possibly induced by EMI and EMC problems. There is a need for a physical board design strategy which reduces these typically extensive efforts.

FIGS. 1a and 1b show two prior art examples of physical circuit board designs. FIG. 1a depicts a PCIe Card 10a comprising a processor 12a, associated memory 14a, I/O ports 16a as well as additional electronic components 18a such as a flash memory, board control unit, connectors etc. FIG. 1b depicts a Blade board 10b comprising dual processors 12b, associated memory 14b, system I/O 16b as well as a variety of Blade specific electronic components 18b. Processors 12a, 12b are identical; also, associated memories 14a, 14b (each comprising of four DIMM slots) are identical, and I/O ports 16a, 16b are also identical. As is seen from FIGS. 1a and 1b, the relative positions of components relative to each other are similar, memory 14a, 14b being located on one side and I/O ports 16a, 16b on the other side of processors 12a, 12b, respectively.

The fact that PCIe Card 10a and Blade motherboard 10b share a set of common electronic components is reflected on the design level: The design data of these systems 10a, 10b comprise identical data processing functions (to be implemented by processors 12a, 12b), associated memory subsystems (to be implemented by DIMM slots 14a, 14b) and I/O functionalities (to be implemented by I/O ports 16a, 16b). Circuit boards 10a, 10b thus share a set of specific Core Functions 20, namely processing units 12, associated memory system 14 and dedicated I/O functions 16, which are interconnected with wiring 17 as schematically depicted in FIG. 1c. In addition, to these Core Functions 20, design data of the circuit boards 10a, 10b contain application specific functionalities 18a, 18b such as system clock generation and its fan-out, system control and management as well as I/O facilities etc.

Even though central electronic functionalities and components 12, 14, 16 of the physical designs 10a, 10b are identical, prior art physical design processes have not been able to take advantage of these similarities for making the physical design process more economical. This is due to the fact that in the process of designing and optimizing the wiring layers within the physical board designs 10a, 10b, prior art physical design methods typically generate layer structures (in technical terminology called layer stacking sequences) which differ from design to design. Also, prior art methods are sensitive to form factors; since the circuit boards 10a, 10b exhibit different form factors which leads to a unique physical design for each board 10a, 10b and thus reduces reusability of physical design features. As a consequence, prior art physical design methodologies have not been able to exploit synergies between designs exhibiting similar or identical Core Functions.

Described herein is one example of a methodology which explicitly takes advantage of functional similarities between electronic designs when constructing physical circuit boards based on these designs, thus reducing the time and cost related to physical board design and lowering development expenditures which impact the final product cost.

In order to achieve this, one aspect of the invention suggests a modular approach of defining, constructing, testing and then reusing Core Modules built on common design features of various physical circuit board layouts sharing a set of Core Components. By storing and reusing these standard Core Modules, the process of generating new circuit board layouts may be simplified considerably.

Figure 6A:
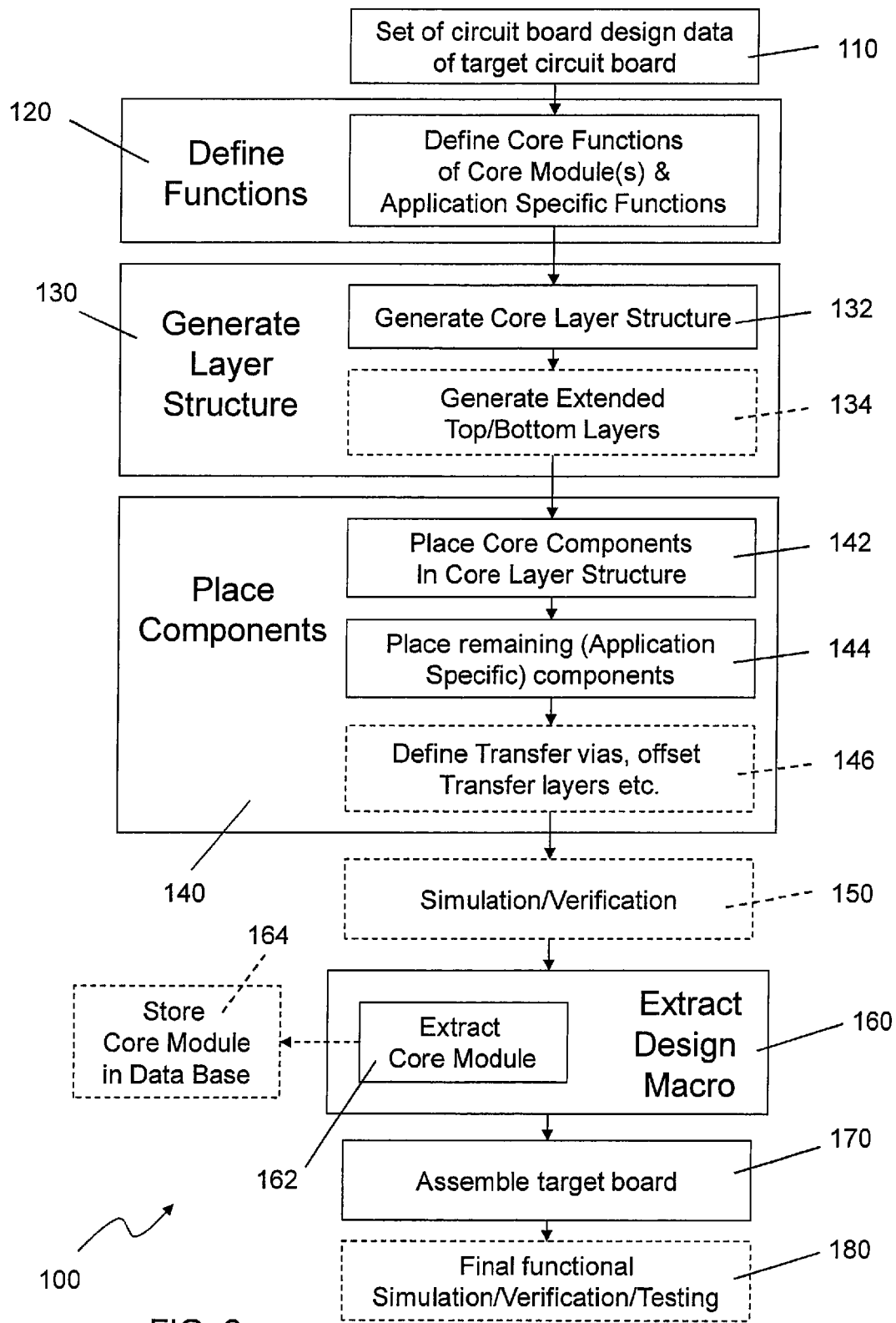
FIG. 6a a schematic flow diagram of a method for generating a physical circuit board according to a first aspect of the invention.

FIG. 6a shows a schematic flow diagram of one embodiment of this methodology. Method 100 of FIG. 6 starts out from a set of design data of a specific circuit board or a product family, for example the PCIe card 10a shown in FIG.

1a (step 110). Based on these design data, central design features/functions are detected and/or defined and identified as Core Functions (step 120). Thus, a logical system partitioning is performed in which some design features are classified as "Core Functions" whereas the rest is classified as "Application Specific Functions". In one example, the Core Functions are chosen to be associated with a specific processor type such as the specific processor 12a of FIG. 1a. In what follows (steps 130, 140, 160), these Core Functions will be cast into Core Modules representing physical design building blocks which may be stored and reused in a variety of related physical board designs.

Figure 2B:
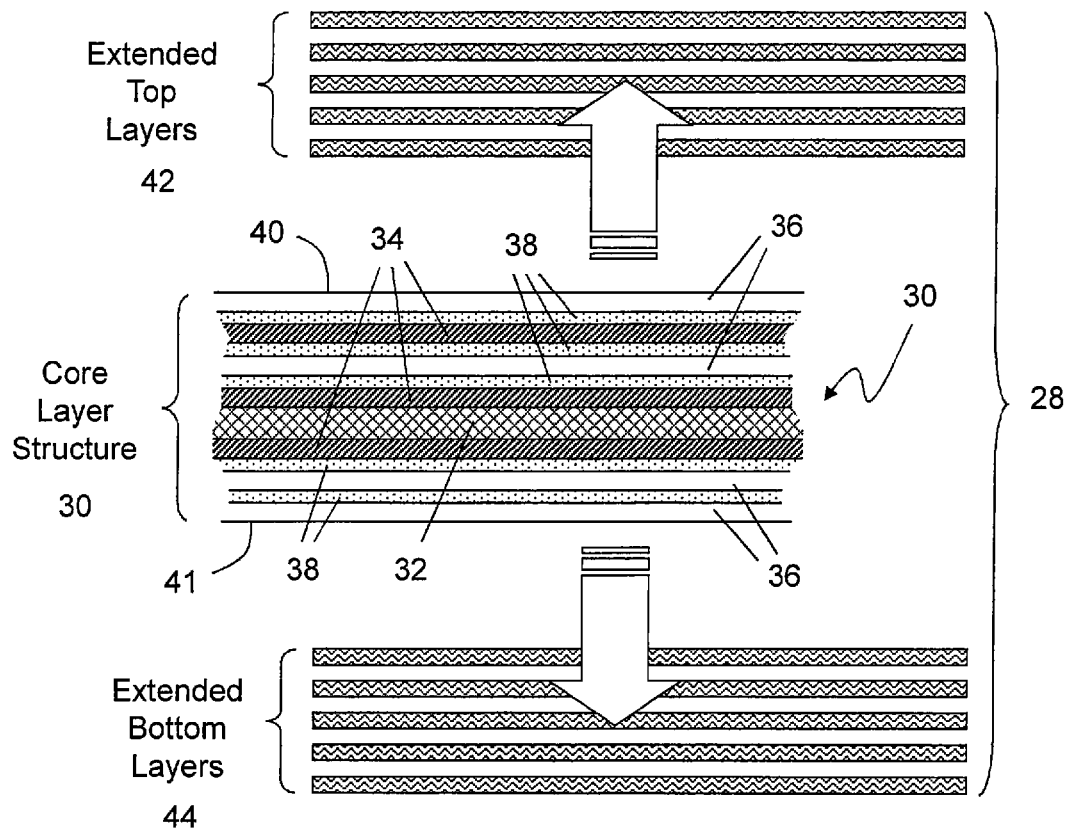
FIG. 2b a detailed view of a physical circuit board layer structure comprising a Core Layer and Extended Top and Bottom Layers.

In the example of FIG. 1a, processing unit 12a, associated memory system 14a and dedicated I/O functions 16a are favored candidates for Core Functions. Based on these Core Functions, a Core Module comprising these Cores Functions is specified, and the corresponding logical design is extracted from the board's design data, potentially reusing existing logical designs using copy and paste. In the example of FIGS. 1a and 2b, the Core Module thus defined may be used in a singular instantiation for the PCIe board product 10a of FIG. 1a, and by a double instantiation for the Blade board 10b of FIG. 1b. For obtaining the full functionality of PCIe board 10a, the Core Module will be supplemented by PCIe Application Specific Functions (such as implemented by flash memory, board control etc.). For the Blade motherboard 10b, Blade specific Application Specific Functions such as additional I/O facilities, management control (BMC) etc. will be added to the two instances of the Core Module, utilizing additional board area and/or adding additional wiring layers.

The Core Modules thus defined form the basis for designing new (or redesigning existing) physical circuits boards. In a first step of translating the design data of a new (or redesigned) circuit board comprising Core Module into a physical circuit board, a layer structure 28 (FIG. 2b) (comprising multiple wiring layers for placing power/ground wiring and interconnections) for this physical circuit board is generated (step 130). Central to this layer structure 28 is a so-called Core Layer Structure 30 which comprises a set of layers which is used to implement the Core Module functions. This Core Layer Structure 30 is constructed (step 132) in such a way that it supports an optimal physical design with respect to system performance and signal integrity and enables component placement for modular reusability. FIG. 2a shows an example of a Core Layer Structure 30 for accommodating a Core Module 20 comprising a processor 12, associated memory subsystem 14 and associated I/O electronics 16. Generally the Core Layer Structure 30 (shown in more detail in FIG. 2b) is built on a central non-conducting substrate 32 (in technical terminology called circuit board core), with stacked ground/power planes 34 and signal planes 36 all of which are electrically insulated by interleaved layers 38 of dielectric. Each of the Core Components 12, 14, 16 has its own specific wiring area, so that the Core Layer Structure 30 of Core Module 20 is a composite structure satisfying the requirements of all Core Components 12, 14, 16.

As described above, the Core Layer Structure 30 is designed to accommodate and wire Core Components 12, 14, 16 of Core Module 20. In addition, Core Layer Structure 30 may also be capable of accommodating some or all of the additional Application Specific Components 18 required for the circuit board under consideration. For example, when constructing the circuit board layer structure 28 for a new PCIe card 10a, such as the one shown in FIG. 1a, the board size extended to the PICe card form factor is sufficient to accommodate all Applications Specific electronic Functions 18a (flash, board control etc.) of this entire PCIe card 10a.

Thus, having adjusted the board space to the specified PCIe card form factor, the Core Layer Structure 30 as defined for the Core Module 20 may be used for positioning and wiring these remaining PCIe specific components 18a, as well as the Core Components 12, 14 and 16. In this case, components 12, 14, 16, 18a will be positioned directly on top and, if required, on the bottom surfaces 40, 41 of the Core Layer Structure 30, as shown in FIG. 4a.

On the other hand, when constructing a layer structure 28 for a more complex circuit board comprising a larger number of additional Application Specific Components, the dedicated Core Layer Structure 30 pertaining to Core Module 20 of this circuit board may not offer sufficient wiring space to accommodate all additional application specific components 18. In this case, additional Extended Top and Bottom Layers 42, 44 are defined and added on both sides of the Core Layer Structure 30 (step 134; FIG. 6a). This is illustrated in FIG. 2b, in which five Extended Top and five Extended Bottom Layers 42, 44 are provided. These Extended Top and Bottom Layers 42, 44 are added symmetrically to the top and the bottom surfaces 40, 41 of the Core Layer Structure 30 and may be used for power/ground or for signal wiring.

Having defined the layer structure 28 of the physical circuit board (step 130), Core Module(s) 20 as well as Application Specific additional electronic Components 18 are placed in step 140 (FIG. 6a). In this step, Core Level Structure 30 is used to accommodate Core Module(s) 20 (step 142), and Application Specific Components are placed using Core Level Structure 30 and/or in Extended Top and Bottom Layers 42, 44 (step 144) depending on spatial requirements.

Figure 3:
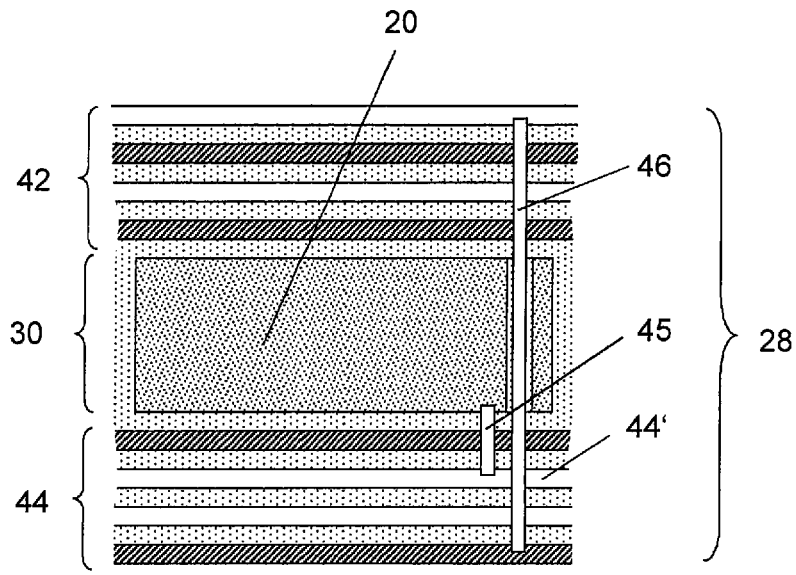
FIG. 3 a sectional view of a physical circuit board layer structure comprising connectors and lead-through vias.

If the board structure comprises Extended Top and Bottom Layers 42, 44, connectors 45 may need to be put in place (step 146) in order to be able to connect the Core Module 20 to specific Extended Top or Bottom Layers 44' (see FIG. 3). Moreover, in order to enable connections from the Top to the Bottom Layers 42, 44, Core Layer Structure lead-throughs 46 may be provided within the Core Module 20 design as part of step 146.

An extended Top and Bottom Layer structure is employed, for example, for the Blade motherboard of FIG. 1b, since the simple Core Layer Structure 30 of FIG. 2a—being constructed in such a way that it will accommodate the Core Modules 20—lacks the space for all Application Specific Components 18b of this Blade motherboard 10b. In one embodiment, Extended Top and Bottom Layers 42, 44 are used, the electronic components 12, 14, 16 pertaining to the Core Module 20 are not to be placed directly on the surfaces 40, 41 of the Core Layer Structure 30, but will reside on the outer surfaces 47, 48 of the topmost/bottommost Extended Top and Bottom Layers 42, 44 (see FIG. 4b). In order to connect these electronic components 12, 14, 16 to their respective electrical contacts 49 in the Core Layer Structure 30, transfer vias 50 are provided in the Top/Bottom Layers 42, 44 during step 146, thus enabling the Core Module 20 to be linked to the outer surfaces 47, 48 of the Top/Bottom Layers 42, 44). Note that board and packaging technologies are becoming available which permit positioning electronic components in between layers, i.e. right within the layered structure; this technology may be used to achieve further design advantages.

In order to satisfy specific physical or thermal requirements it may be necessary or desired to place some application specific electronic components 18' in pre-defined locations on the circuit board. As shown in FIG. 4c, these application specific components 18' may block board space originally reserved for Core Module components 14b. In this case, the perpendicular transfer vias 50 of FIG. 4b are not to be used; rather, an additional layer (so called Offset Transfer Layer 42') is introduced as part of step 146 in order to accommodate adjustment traces 51 which connect the Core Layer Structure contacts 49 to transfer vias 50' which are shifted to allow for application specific component 18'. The direct transfer vias 50 of FIG. 4b are thus replaced by adjusted transfer vias 50' connecting to the repositioned electronic component 14 to the Offset Transfer Layer 42', and adjustment traces 51 are provided to connect the Offset Transfer Layer 42' to the appropriate Core Layer Structure 30 connections 49. The Offset Transfer Layer 42' may be implemented by adding an additional layer to the Extended Top Layer structure 42. However, in one embodiment, if one of the Extended Top/Bottom Layers 42 happens to have a lower local wiring density, this layer may thus be used to accommodate the Offset Transfer Layer 42'; this is shown in FIG. 4c where the lowest Extended Top Layer 42 is used for accommodating Offset Transfer Layer 42'.

Figure 5:
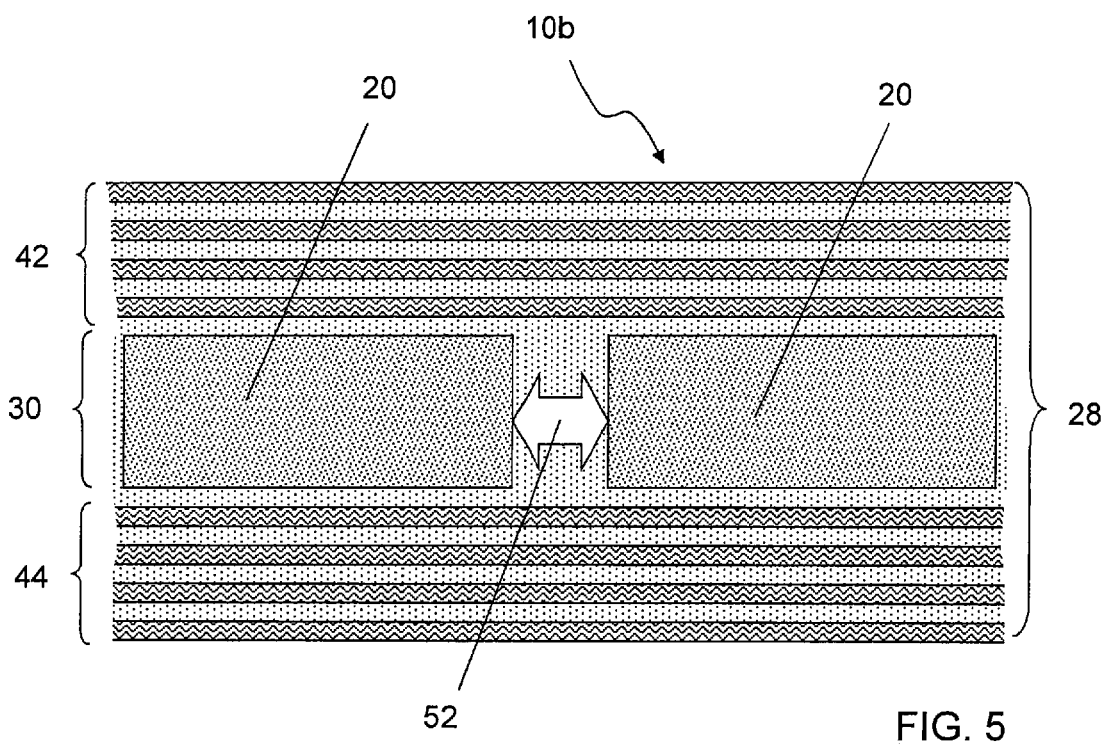
FIG. 5 a schematic sectional view of a physical board design comprising two identical Core Modules.

When constructing the circuit board layer structure of a Blade Board 10b, such as the one shown in FIG. 1b, the pre-defined Core Module 20 is applied twice for the dual processor system of FIG. 1b. The two Core Modules 20 reside in the Core Layer Structure 30 which is interleaved between Top and Bottom Layers 42, 44, thus building up the layered structure of the Blade motherboard 10b. FIG. 5 illustrates the two Core Modules 20 placed on the Core Layer Structure 30. Each Core Module 20 of the Blade motherboard 10b is identical to the Core Module 20 used in the PCIe card 10a described above and consists of a processor 12, the associated memory subsystem 14 as well as an I/O subsystem 16 as well as all wiring etc. In addition to the connectors 45, 46, 50, 50' and 51 described in conjunction with FIGS. 3, 4b and 4c, connections 52 may be defined within the Core Layer Structure 30 as part of step 136, allowing direct interconnections between the adjacent Core Modules 20.

Once the Core Module(s) 20 and application specific components 18 have been placed, and vias, transfer layers etc. for connecting these, the electronic components have been provided as indicated in step 140. A first simulation/verification of the physical board design is carried out (step 150; FIG. 6a). Subsequently, the design macros including the fully simulated traces, vias and design constraints are extracted in step 160. As part of this extraction, a physical implementation of Core Module 20 is generated (step 162). This physical implementation of Core Module 20 may be stored in a database (step 164) for further use, e.g. in the design or redesign of a new physical board design which employs the same Core Module. This is followed by an assembly of the target circuit board (step 170) and additional (final) testing (step 180).

Figure 6B:
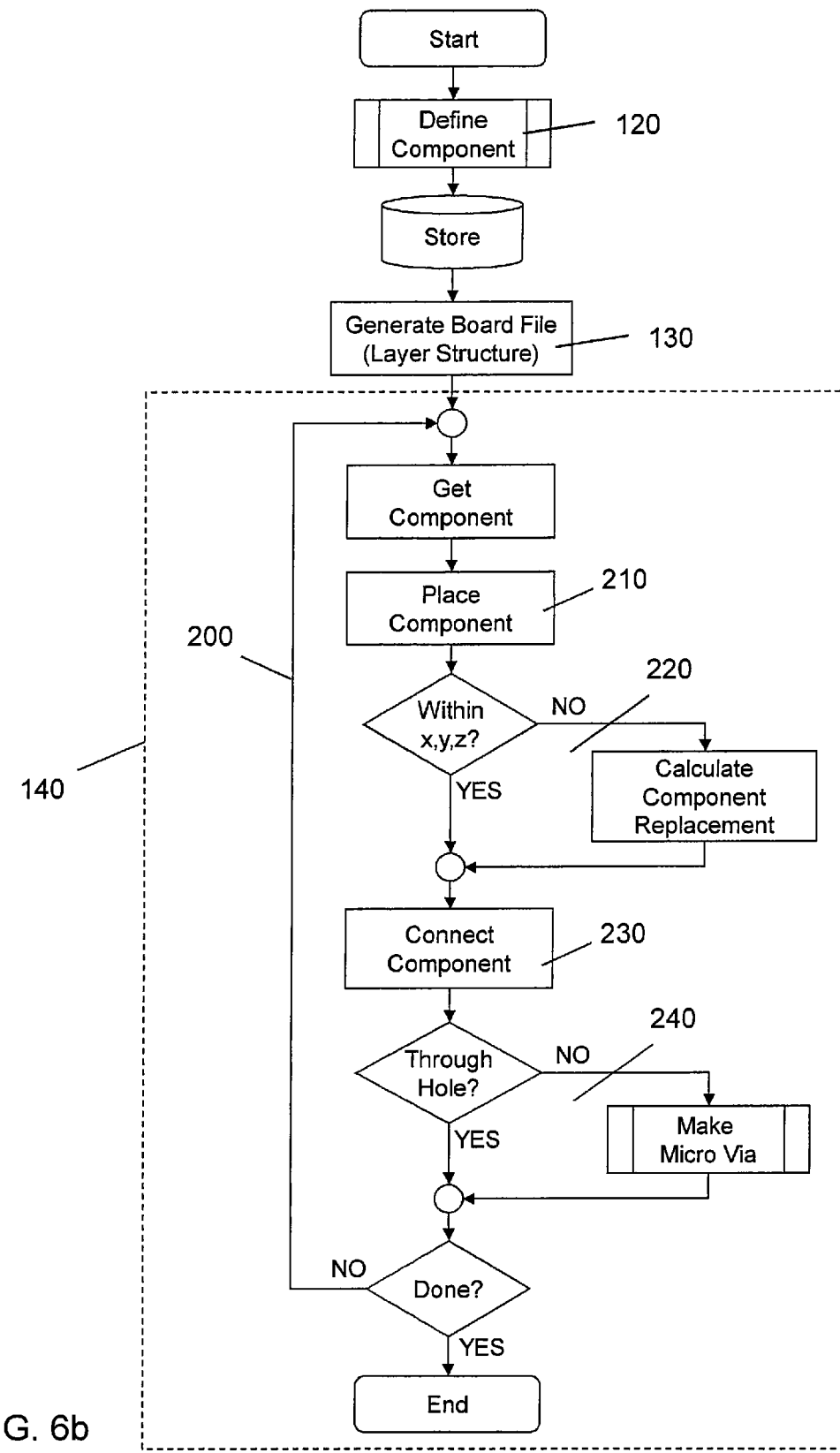

An implementation of the placement step 140 of method 100 is shown in the flow diagram of FIG. 6b. As is seen, placement step 140 is performed step-by-step (loop 200), iteratively placing all components. The individual components are tentatively placed in step 210 and iteratively moved to a different location within the circuit board if a collision with other components is found to occur, as shown in FIG. 4c (step 220). Subsequently the component is connected (step 230). If the connection is found to require vias or through holes, these are generated in step 240.

FIG. 6b shows that, by following one implementation of the methodology of the invention, the component placement and physical board wiring procedure—formerly driven by engineering experience aided by automated wiring tools—may be transformed into algorithms to be implemented with state of the art programming tools. By the same token, an algorithm for calculating the optimum planar stack assignment (Core Layer Structure 30) for the Core Module(s) 20 can be generated. Based on these algorithms, standard programming languages can be used to map this methodology into an automated design procedure, and a considerably automation of the design steps leading to a physical circuit board layout may be reached. Programming languages comprising Artificial Intelligence (AI) features (such as Lisp, Prolog, Python or Skill/Skill+) are particularly well suited for implementing one example of this methodology. Since physical board design usually makes use of commercially available board design tools, it is advantageous, in one example, to employ programming capabilities which are part of the specific design tool. For example, when using the Cadence board design tool featuring the Skill+ programming language, Skill+ is well suited to implement the methodology shown in FIG. 6b.

In one aspect, the methodology outlined in FIG. 6a may be used to support automated physical board design for whole product families sharing common design features. This is schematically shown in the flow diagram of FIG. 7a which outlines a method 100a of creating readily wired Core Module(s) of a product family and makes them available to designers as building blocks for physical board design of new family members. In a first step 120a of method 100a, the product family in focus is analyzed in order to identify electronic portions with similar functionality and to extract identical components. These matching components are used for constructing one or multiple Core Module(s) which may be reused for the various designs of the product family. Subsequently, an optimum planar stack assignment (Core Layer Structure 30) is calculated for accommodating the Core Modules (step 130a), and an optimized placement for all Core Components within the Core Module(s) is calculated (step 140a). In addition to the optimal placement, alternative positions are calculated for those Core Components for which target product specific physical constraints are expected and may require placing these Core Components on different positions rather than applying optimum placement. The physical designs of the Core Module(s) thus constructed are verified in step 150a in order ensure that the Core Module(s) satisfy performance expectations, signal integrity etc. In the final design step, design macro(s) pertaining to the Core Modules are generated in step 160a. These design macro(s) are stored in a database (step 164a)—for example, in the form of a dedicated design library—so that they can be reused in the physical board design of member products of the product family under consideration.

Figure 7A:
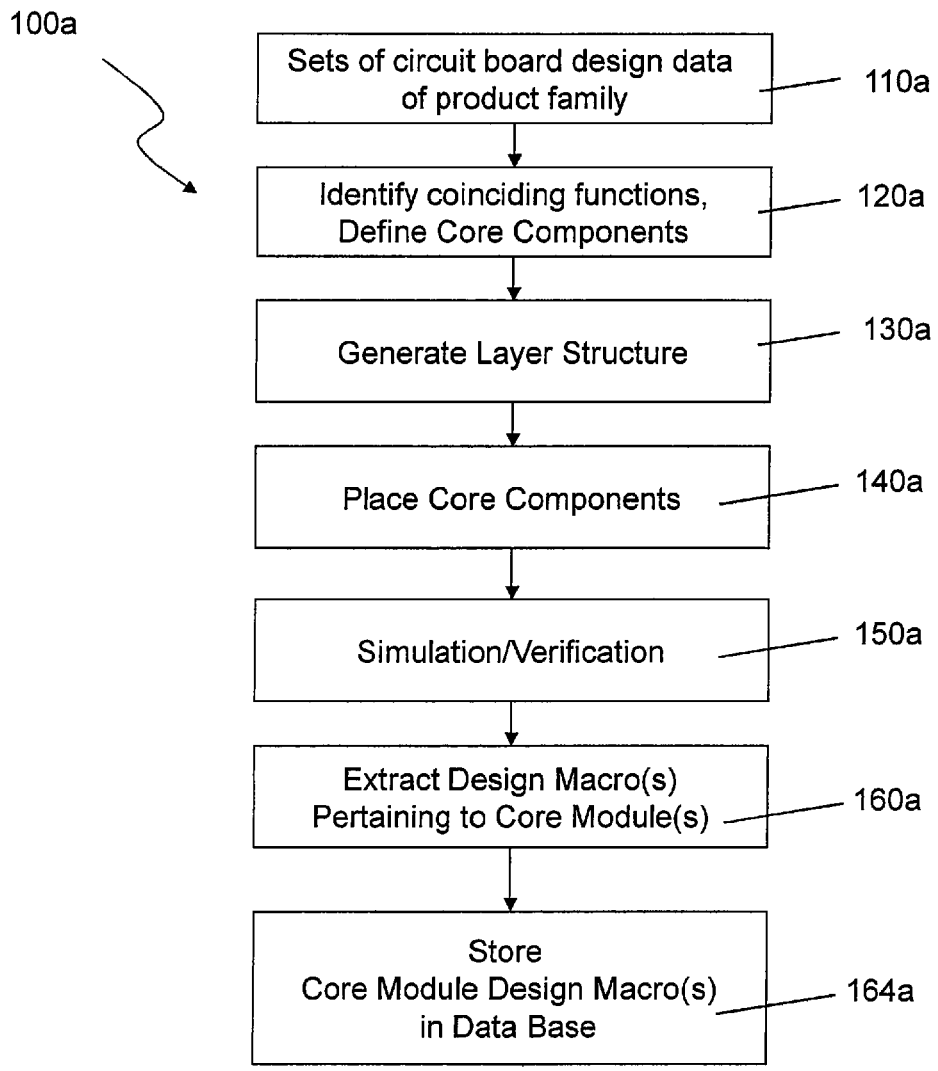
FIG. 7a a schematic flow diagram of a method for generating a Core Module pertaining to a product family of circuit boards according to a second aspect of the invention.
Figure 7B:
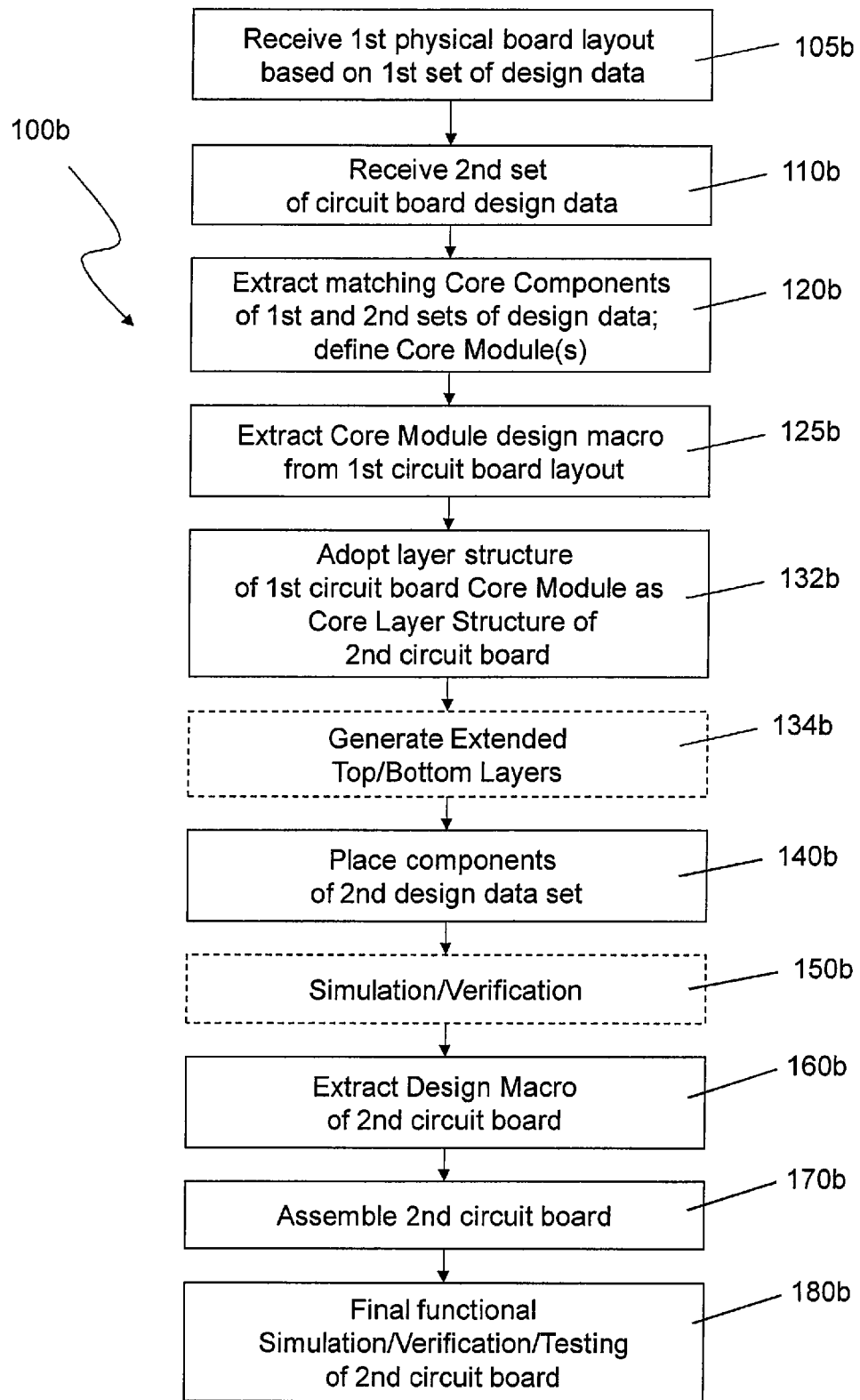
FIG. 7b a schematic flow diagram of a method for generating a second ("new") physical circuit board layout by reusing features of a first ("old") physical circuit board design according to a third aspect of the invention.

FIG. 7b illustrates another example of how the methodology of FIG. 6a may be used to automate and facilitate physical circuit board design. Assume that an existing (first) circuit board design which has been extensively tested and validated is to undergo a modification or redesign, thus developing a new (second) circuit board. FIG. 7b illustrates a method 100b which will furnish a solution to this problem. Method 100b sets out with the physical board design of the first (state of the art) circuit board as well as the associated design data set (step 105b) and a set of circuit board design data of the target (new) circuit board to be developed (step 110b). By comparing first and second sets of design data, matching functions are extracted; based on these matching functions, Core Module (s) comprising some or all of these matching functions are defined (step 120b). Subsequently, the design macro(s) of the first circuit board are analyzed in order to extract a design macro pertaining to the Core Components of the Core Module defined in step 120b (step 125b). This design macro contains information on the underlying layer structure, i.e. the number and stacking sequence of layers which is used to implement the Core Module functions. This layer structure as extracted from the design macro of the first (old) circuit board is adopted as the Core Layer Structure for the second (new) circuit board design (step 132*b*). Depending on the number and kind of Application Specific Functions in the second set of design data, Extended Top/Bottom Layers may need to be added (step 134*b*). Subsequently, all components of the second circuit board design are placed on the layer structure developed in steps 132*b* and 134*b* (step 140*b*), followed by optional simulations and testing (step 150*b*). Once the placed and wired arrangement of components is found to fulfill functional and performance requirements, a design macro is generated (step 160*b*) as the basis for the assembly of the second (new) design circuit board (step 170*b*). This is followed by final functional testing and simulations (step 180*b*).

Aspects of the methodology as exemplified in methods 100, 100*a* and 100*b* constitute a comprehensive modular approach for developing complex electronic circuit boards as the ones shown in FIGS. 1*a* and 1*b*. One or more aspects of the methodology is applicable both to the development of new system designs and to migrations of existing system designs to new or different circuit board form factors. One feature of this methodology is the ability to extract design features from (previous) circuit board layouts and to utilize and reuse them as complete physical design modules. One aspect or more aspects of the methodology makes use of the definition and reuse of Core Modules as building blocks as well as automation and may be used to replace state of the art procedures.

By defining the Core Modules as comprising those design functions which are critical with respect to the basic system functionality, design attention is focused on these vital functions and circuit board layout may be optimized and adjusted to enable top performance of these functions. Additional application specific components are less critical and thus may be placed in the remaining circuit board areas (or in additional layers).

Note that while method 100*b* uses a comparison between first and second circuit board designs in order to extract common features furnishing the Core Module(s), it is also possible to scan a data base (notably, the dedicated design library mentioned above) for stored Core Module(s) which may be used as building blocks for the second (new) circuit board design. The layer structures associated with these Core Module(s) are used for the Core Layer Structure of the second (new) circuit board design, as described above.

Note that simulation and verification procedures (steps 150, 150*a*) may be put in place as part of the Core Module development, as shown in FIG. 6*a*. As a consequence, the physical board design process uses and reuses Core Modules which have been thoroughly tested and thus exhibit a high level of functional maturity. This reduces final testing time of the physical circuit board (as carried out in step 180, 180*a*) and reduces the EMI/EMC risk and associated redesign efforts for new board designs. The modular approach to physical board design enables maximum utilization of processor performance through improved Core Module interconnection wiring and reduced capacitive load. Development of complex board designs is simplified and accelerated constructing and optimizing Core Modules is provided, which may then be reused in a variety of different applications.

When reusing this Core Module for a new physical design, performance data need not be reevaluated, and high-speed system components and subsystems need not be re-characterized. Moreover, the danger of undetected system failure risks is reduced when applying mature Core Modules to new product designs. This may be especially valuable when new product development is carried out off-shore or by subsidiary companies. Note that the modular approach also helps to protect proprietary information related to overall system design, since competitors, when performing reverse engineering of individual physical circuit boards, will generally not be able to extract the underlying modular structure of these designs.

As pointed out above, the modular physical design approach described in one aspect may be implemented by using existing structured design algorithms which are ideally suited to transform the individual steps of this methodology into an automated physical board design process. In a structured approach, one or more aspects of this methodology is capable of redefining the well-established board design procedures by combining new design steps in conjunction with program algorithms for (a) generating Core Modules as readily placed and wired multistack entities and (b) combining these Core Modules with additional Application Specific Functions, thus yielding new board designs.

One aspect of the invention includes bequeathing optimized and exhaustively tested Core Modules to new board designs by placing them onto the new design board's Core Layer Structure as a "seed" and to enhance this Core Layer Structure by additional Extended Layers (for accommodating Application Specific Electronics), thus "growing" a stack of multiple wiring layers from inside out and generating a new overall physical board structure.

Figure 8:
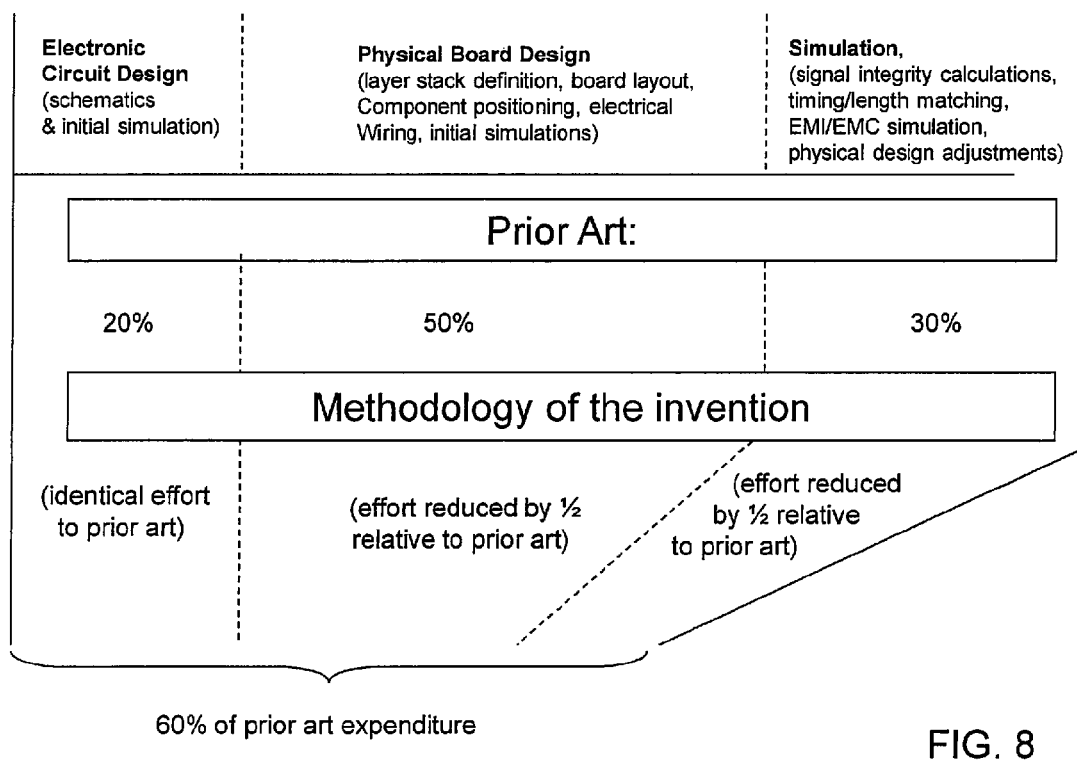
FIG. 8 a schematic diagram illustrating the reduction of design efforts to be attained by using one or more aspects of the methodology of the invention.

FIG. 8 shows a schematic diagram illustrating how physical design expenditures may be reduced by using one or more aspects of the methodology of the invention as illustrated by FIGS. 6*a*, 7*a* and 7*b*. Electronic circuit design (comprising initial block diagram development, schematic entry procedures and potential initial simulations) makes up about 20% of total development effort and will not be influenced by one or more aspects of the methodology presented herein. Development time and effort for physical board design (layer definition, board layout and component positioning, electrical wiring and initial simulations), which in prior art methods accounts for about 50% of total development effort, is expected to be reduced by about 50% if one or more aspects of the methodology of the invention is applied. Final testing and optimizations (such as signal integrity calculations, timing/length matching, design adjustments etc.), which in prior art methods accounts for about 30% of total development effort, may also be reduced by a large extent since one or more aspects of the methodology employs reusable Core Modules which have reached a high level of functional, SI and EMI/EMC maturity and have undergone extensive individual testing. In summary, it is expected that by using one or more aspects of the methodology described herein, development time for physical circuit boards may be reduced by 40% compared to prior art approaches. These advantages will be even greater when one or more aspects of the methodology of the invention is applied to the design of entire product families. This methodology thus enables a significant reduction in design efforts as well as a decrease in design risk when developing new board designs. The modular approach for physical board design thus yields considerable cost advantages due to reduced development time for new system designs and enables shorter time to market for new products.

One or more aspects of the methodology described herein may be used in the design of motherboards as used in desktop computers and workstations, blade servers, feature cards such as PCIX and PCIe, high volume low end servers (such as iDataPlex, an IBM trademark), stand alone work stations, set top boxes, general electronic rack-mount systems such as industrial cabinet/rack mount electronic systems, machine control electronics (e.g. for automotive applications), dedicated planar boards for industrial electronic systems etc. It can be used to generalize system board core designs by means of utilizing identical electrical board designs and physical Core Modules for various system form factors.

Figure 9:
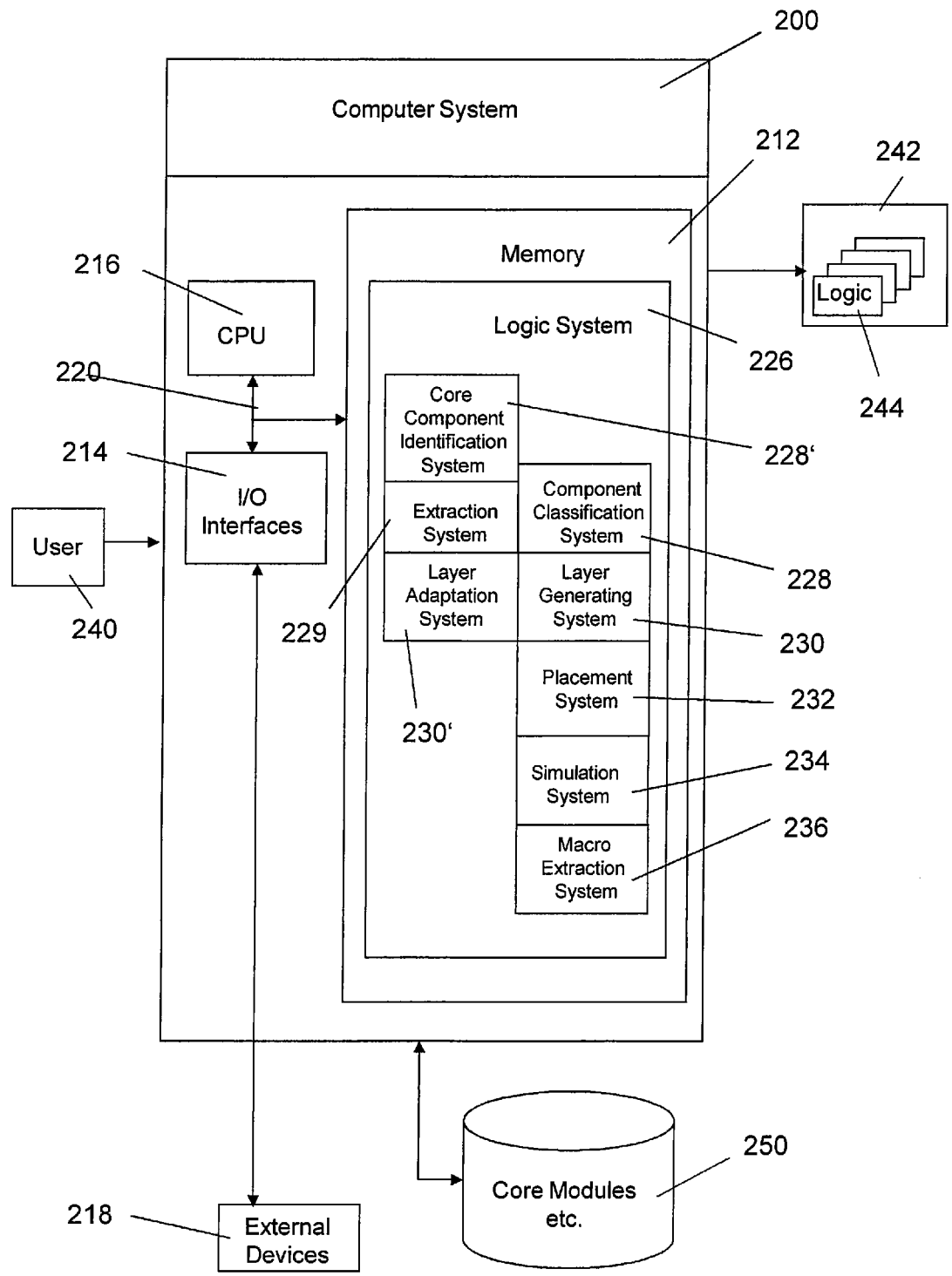
FIG. 9 a computer system implementation of a one method for generating a physical design for an electronic circuit board.

Referring now to FIG. 9, a computer system 200 implementation of one embodiment of the present invention is shown. Specifically, one embodiment of the present invention can be implemented as a computer system 200 and/or program product for generating a physical design for an electronic circuit board, based on design data comprising a set of electronic components. One embodiment of the present invention may also be implemented as a computer system 200 and/or program product for generating a Core Module for a product family of circuit boards. Moreover, one or more aspects of the invention may be implemented as a computer system 200 and/or program product for generating a second physical circuit board layout by reusing features of a first physical circuit board layout. This allows a user 240, for example a circuit board designer, to generate a physical circuit board based on a highly effective modular approach using so-called Core Modules which may be optimized and reused for a variety of physical implementations.

As depicted, computer system 200 generally comprises memory 212, input/output (I/O) interfaces 214, a central processing unit (CPU) 216, external devices/resources 218, bus 220 and data base 250. Memory 212 may comprise any known type of data storage and/or transmission media, including magnetic media, optical media, random access memory (RAM), read-only memory (ROM), a data cache, a data object etc. Moreover, memory 212 may reside at a single physical location, comprising one or more types of data storage, or can be distributed across a plurality of physical systems in various forms. CPU 216 may likewise comprise a single processing unit, or be distributed across one or more processing units in one or more locations, e.g. on a client and server. I/O interfaces 214 may comprise any system for exchanging information from an external source, for example keyboards, displays, pointing devices, etc. and can be coupled to computer system 200 either directly or through intervening I/O controllers. External devices 218 may comprise any known type of external device, including keyboard, mouse, voice recognition system, printer, monitor, facsimile etc. Bus 220 provides a communication link between each of the components in the computer system 200 and likewise may comprise any known type of transmission link, including electrical, optical, wireless etc. In addition, although not shown, additional components such as cache memory, communication systems, system software etc. may be incorporated into computer system 200. Network adapters may also be coupled to the system to enable the data processing system or remote printers or storage devices through intervening private or public networks. Modems, cable modem and Ethernet cards are just a few of the currently available types of network adapters.

Database 250 provides storage for information used to carry out one or more aspects of the present invention. Such information could include e.g. various sets of electronic circuit board design data, Core Module design macros, information on product families etc. Database 250 may include one or more storage devices, such as a magnetic disk drive or an optical disk drive. In another embodiment, database 250 includes data distributed across, for example, a local area network (LAN), wide are network (WAN) or a storage area network (SAN). Database 250 may also be configured in such a way that one of ordinary skill in the art may interpret it to include one or more storage devices. Moreover, it should be understood that database 250 could alternatively exist within computer system 200.

Stored in memory 212 is logic system 226. As depicted, logic system 226 generally includes a variety of systems 228-236 which carry out the functions described above:

Component Classification System 228 is used for classifying a set of electronic components pertaining to a design data set in such a way that each component is labeled either as a Core Component or as an Application Specific Component:

Core Component Identification System 228' is used for identifying concurring functions or components of various design data sets and defining at least one Core Module as comprising multiple Core Components;

Extraction System (229) is used for extracting a Core Module from a physical circuit board layout, the Core Module corresponding to a wired layout of the Core Components;

Layer Generating System 230 is used for generating a circuit board layer structure comprising a Core Layer Structure;

Placement System 232 is used for placing the Core Components onto the Core Layer Structure generated in Layer Generating System 230;

Simulation System 234 is used for performing simulations of the physical design(s) thus generated;

Macro Extraction System 236 is used for extracting design macro(s) of the physical design(s) thus generated.

In one aspect of the invention, a physical board design methodology is provided, which maximizes reusability of preceding designs which have proven to meet performance and reliability requirements. In one embodiment, a methodology is provided, which enables efficient physical board designs of a product family of electronic circuit boards comprising identical or similar functionalities. The methodology is applicable, as examples, to new system designs, as well as migrations of existing system designs to new or different circuit board form factors.

One or more aspects of the invention can take the form of an entirely hardware embodiment, an entirely software embodiment or an embodiment containing both hardware and software elements. In one embodiment, one or more aspects of the invention is implemented in software, which includes but is not limited to firmware, resident software, microcode, etc.

Furthermore, one or more aspects of the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

What is claimed is:

1. A method for generating a physical circuit board based on design data comprising a set of electronic components, said method comprising:

classifying each of said electronic components either as a Core Component or as an Application Specific Component;

generating a circuit board layer structure comprising a Core Layer Structure;

placing said electronic components onto said circuit board layer structure in such a way that said Core Components are placed onto the Core Layer Structure, wherein the placing comprises generating at least one Transfer via or Offset Transfer Layer for coupling to the Core Layer Structure through a layer adjacent to the Core Layer Structure;

extracting a design macro of a physical design thus generated; and assembling said physical circuit board.

2. The method of claim 1, wherein the layer comprises an Extended. Top Layer or an Extended Bottom Layer adjacent to the Core Layer Structure, and wherein generating the circuit board layer structure comprises generating the Extended Top Layer or Extended Bottom Layer.

3. The method of claim 2, wherein the at least one Transfer via or Offset Transfer Layer solves a blockage in the Extended Top Layer or Extended Bottom Layer.

4. The method of claim 1, wherein the classifying comprises generating at least one Core Module comprising multiple Core Components.

5. The method of claim 4, wherein the placing comprises placing several Core Modules onto the Core Layer Structure and forming an interconnection between said Core Modules.

6. The method of claim 4, wherein the extracting comprises extracting a design macro of said Core Module.

7. The method of claim 6, further comprising storing said design macro in a data base.

8. The method of claim 1, further comprises performing an intermediate verification of a design of said physical circuit board.

9. The method of claim 1, further comprising:
receiving multiple sets of design data for a product family of circuit boards;
identifying concurring functions or components of the multiple sets and defining at least one Core Module as comprising multiple Core Components; and
wherein the generating comprises generating a circuit board Core Layer Structure for accommodating said multiple Core Components.

10. The method of claim 1, further comprising:
receiving a first physical circuit board layout based on a first set of design data comprising a first set of electronic components;
receiving a second set of design data for a second physical circuit board layout, said second set of design data comprising a second set of electronic components;
identifying Core Components as matching electronic components of the first and second set of design data;
extracting a Core Module from the first physical circuit board layout, said Core Module corresponding to a wired layout of said Core Components; and
adopting a circuit board layer structure of said Core Module as a Core Layer of a board layer structure for said second circuit board.

11. A computer system for generating a physical circuit board based on design data comprising a set of electronic components, said computer system comprising:
a memory; and
a processor in communications with the memory, wherein the computer system is configured to perform a method, said method comprising:
classifying each of said electronic components either as a Core Component or as an Application Specific Component;
generating a circuit board layer structure comprising a Core Layer Structure;
placing said electronic components onto said circuit board layer structure in such a way that said Core Components are placed onto the Core Layer Structure, wherein the placing comprises generating at least one Transfer via or Offset Transfer Layer for coupling to the Core Layer Structure through a layer adjacent to the Core Layer Structure;
extracting a design macro of a physical design thus generated; and
assembling said physical circuit board.

12. The computer system of claim 11, wherein the layer comprises an Extended Top Layer or an Extended Bottom Layer adjacent to the Core Layer Structure, and wherein generating the circuit board layer structure comprises generating the Extended Top layer or Extended Bottom Layer.

13. The computer system of claim 12, wherein the at least one of Transfer via or Offset Transfer Layer solves a blockage in the Extended Top Layer or Extended Bottom Layer.

14. The computer system of claim 11, wherein the classifying comprises generating at least one Core Module comprising multiple Core Components, and wherein the placing comprises placing several Core Modules onto the Core Layer Structure and forming an interconnection between said Core Modules.

15. The computer system of claim 11, wherein the method further comprises performing an intermediate verification of a design of said physical circuit board.

16. The computer system of claim 11, wherein the method further comprises:
receiving multiple sets of design data for a product family of circuit boards;
identifying concurring functions or components of the multiple sets and defining at least one Core Module as comprising multiple Core Components; and
wherein the generating comprises generating a circuit board Core Layer Structure for accommodating said multiple Core Components.

17. The computer system of claim 11, wherein the method further comprises:
receiving a first physical circuit board layout based on a first set of design data comprising a first set of electronic components;
receiving a second set of design data for a second physical circuit board layout, said second set of design data comprising a second set of electronic components;
identifying Core Components as matching electronic components of the first and second set of design data;
extracting a Core Module from the first physical circuit board layout, said Core Module corresponding to a wired layout of said Core Components; and
adopting a circuit board layer structure of said Core Module as a Core Layer of a board layer structure for said second circuit board.

18. A computer program product for generating a physical circuit board based on design data comprising a set of electronic components, said computer program product comprising:
a computer readable storage medium readable by a processing circuit and storing instructions for execution by the processing circuit for performing a method comprising:

classifying each of said electronic components either as a Core Component or as an Application Specific Component;

generating a circuit board layer structure comprising a Core Layer Structure;

placing said electronic components onto said circuit board layer structure in such a way that said Core Components are placed onto the Core Layer Structure, wherein the placing comprises generating at least one Transfer via or Offset Transfer Layer for coupling to the Core Layer Structure through a layer adjacent to the Core Layer Structure;

extracting a design macro of a physical design thus generated; and assembling said physical circuit board.

19. The computer program product of claim 18, wherein the method further comprises:

receiving multiple sets of design data for a product family of circuit boards;

identifying concurring functions or components of the multiple sets and defining at least one Core Module as comprising multiple Core Components; and wherein the generating comprises generating a circuit board Core Layer Structure for accommodating said multiple Core Components.

20. The computer program product of claim 18, wherein the method further comprises:

receiving a first physical circuit board layout based on a first set of design data comprising a first set of electronic components;

receiving a second set of design data for a second physical circuit board layout, said second set of design data comprising a second set of electronic components;

identifying Core Components as matching electronic components of the first and second set of design data;

extracting a Core Module from the first physical circuit board layout, said Core Module corresponding to a wired layout of said Core Components; and adopting a circuit board layer structure of said Core Module as a Core Layer of a board layer structure for said second circuit board.

\* \* \* \* \*